United States Patent [19]

Wu

[11] Patent Number: 6,091,119

[45] Date of Patent: Jul. 18, 2000

[54] DOUBLE POLY-GATE HIGH DENSITY MULTI-STATE FLAT MASK ROM CELLS

[75] Inventor: Shye-Lin Wu, Hsinchu, Taiwan

[73] Assignee: Acer Semiconductor Manufacturing Inc., Hsinchu, Taiwan

[21] Appl. No.: 09/113,931

[22] Filed: Jul. 10, 1998

[51] Int. Cl.[7] .............................................. H01L 21/8246
[52] U.S. Cl. ........................................ 257/390; 257/391
[58] Field of Search .................................... 257/390–391; 438/275–278

[56] References Cited

U.S. PATENT DOCUMENTS

| 5,556,800 | 9/1996 | Takizawa et al. . | |
| 5,576,573 | 11/1996 | Su et al. .................................. | 257/391 |
| 5,585,297 | 12/1996 | Sheng et al. . | |
| 5,683,925 | 11/1997 | Irani et al. . | |

OTHER PUBLICATIONS

T.P. Ong, CVD $SiN_x$ Anti–reflective Coating for Sub–$0.5\mu m$ Lithography, 1995 Symposium on VLSI Technology Digest of Technical Papers, Apr. 1995, pp. 73–74.

Bertagnolli et al., RCS: An Extremely High Density Mask ROM Technology Based On Vertical Transistor Cells, 1996 Symposium on VLSI Technology Digest of Technical Papers, pp. 58–59.

*Primary Examiner*—Jey Tsai
*Attorney, Agent, or Firm*—Harness, Dickey & Pierce, P.L.C.

[57] ABSTRACT

The mask ROM cell structure is described as follows: a plurality of first polysilicon gates is formed on the semiconductor substrate, being separated to keep a space. Each of first polysilicon gates comprises first nitride layer/ a n+ polysilicon layer/a first pad oxide layer, and two spacers that formed over the remnant portion of the pad oxide layer, and formed, respectively, on two sidewalls of the first nitride layer 130, and the first n+ polysilicon layer. A plurality of second polysilicon gates is formed on the semiconductor substrate 105. Each of the second polysilicon gates comprises second n+doped polysilicon gate/second pad oxide layer, wherein the pad oxide layer is formed on the semiconductor substrate, and the n+doped polysilicon gate is formed on the second pad oxide layer. The first polysilicon gates separate the second polysilicon gates each.

18 Claims, 6 Drawing Sheets

DOUBLE POLY-GATE HIGH DENSITY MULTI-STATE FLAT MASK ROM CELLS

FIELD OF THE INVENTION

The present invention relates to a semiconductor device, and more specifically, to a structure of double poly-gate high-density multi-state flat mask ROM cells.

BACKGROUND OF THE INVENTION

In recently years, the development of the portable telecommunications and laptop computers has become a major driving force in semiconductor IC's design and technology. One of most attractive semiconductor's merchandises is a very high-density non-volatile mask ROM. To achieve very high-density mask ROM, a novel semiconductor mask ROM technology incorporating a vertical cell is aiming at this objective and was proposed by Bertagnoili et al., in the reference, "B. Bertagnoili et al., 'ROS: An Extremely High Density Mask ROM Technology Based On Vertical Transistor Cells', Symp. on VLSI Tech. Dig., p, 58, 1996." The key of the technology is a cell concept based on a vertical MOS transistor in a trench which allows to use the bottom of the trench as additional -elf-aligned bit line, and thus to double the bit line density. The technology is enabling an approximately twofold packing density compared to conventional planar ROM.

An alternatively method to double the storage capacity is using a novel multi-state ($\geq 3$ kinds of state) concept. Such a memory cell can double the storage capacities without increasing chip area. For example, if memory cells store only data "0" and "1" states, a more great number of mask ROM cell transistors should be demanded to provide storage data as compare with that of memory cells which can store four kind of states, called multiple state mask ROM cells.

Figure 1:
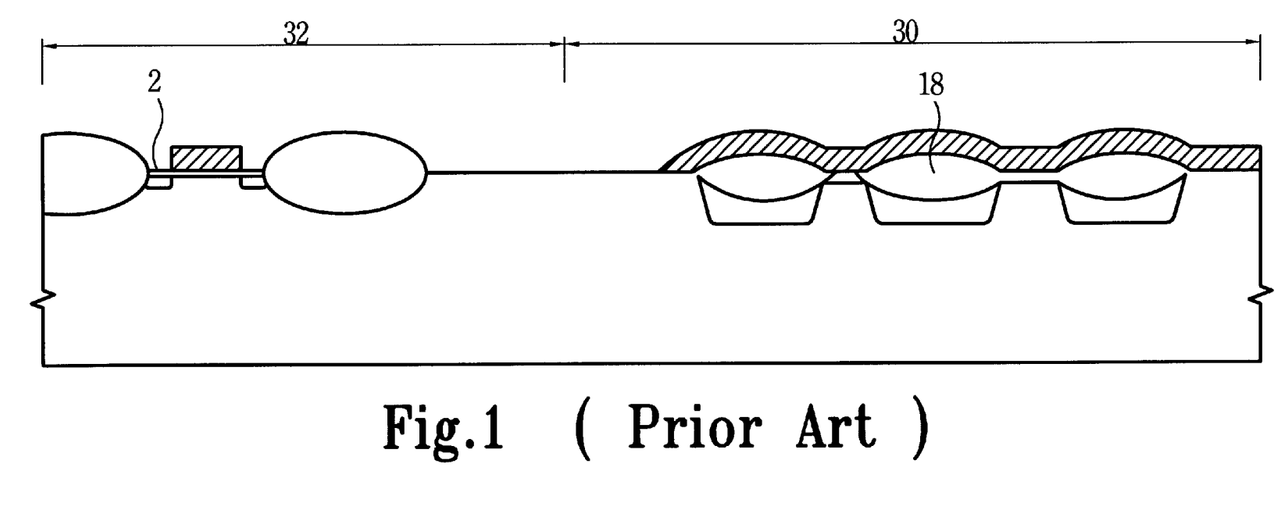
FIG. 1 is a cross-sectional view of a mask ROM cell array, in accordance with the prior art.

A conventional multi-value ROM stores with more than three states, in the manner that changes the threshold voltage of memory cell transistors is given by Sheng et al., in U.S. Pat. No. 5585,297 issued on Dec. 17, 1996. A plurality of ion implantation stages using boron ions is performed incorporating with using a plurality of different mask patterns and different dosage level. However, the high dose boron coding implant will result in a lower junction breakdown performance of the coded MOSFET and a very high band-to band leakage current between the adjacent cells as is stated in the reference "U.S. Pat. No. 5,683,925, to Irani et al., issued on Nov. 4, 1997." Hence, Irani et al., in their patent proposed a method of fabricating the mask ROM to solve above issues. In the method, a thick gate oxide layer 18 is thermally grown within ROM array area 30, even the gate oxide 2 in the periphery 32 is thinner, as shown in FIG. 1.

An alternative method is proposed by Takiziawa et al., in U.S. Pat. No. 5,556,800 issued on Sep. 17 (1996)." Takiziawa et al., on the contrary, in the manner that varies the gate insulating layer's thickness to change the threshold voltage of channel region. The channel region is divided into dual parts; one divided part having a different gate oxide thickness from the other, and thus a different transitivity for ion implant. Namely, the gate electrode has different characteristics of a drain current corresponding to a gate voltage ($I_D$-$V_G$) in the channel regions adjacent to each other.

SUMMARY OF THE INVENTION

The forgoing prior art require either divided a gate into two portions, which have different gate oxide thickness or performed multi-implant stages so as to produce multi-state threshold voltage mask ROM. Hence the processes are rather complicated or with band-to-band leakage issues. The present invention disclose a structure and recipe which combine the concepts of the double the bit line density and multi-state storage way to fabricate double poly gate high density multi-state flat mask ROM cells on a silicon substrate.

The mask ROM cell structure is described as follows: a plurality of first polysilicon gates is formed on the semiconductor substrate, being separated to keep a space. Each of first polysilicon gates comprises first nitride layer/ a n+ polysilicon layer/a first pad oxide layer, and two spacers that formed over remnant portion of the pad oxide layer, and formed, respectively, on two sidewalls of the first nitride layer 130, and the first n+ polysilicon layer. A plurality of second polysilicon gates is formed on the semiconductor substrate 105. Each of the second polysilicon gates comprises second n+ doped polysilicon gate/second pad oxide layer, wherein the pad oxide layer is formed on the semiconductor substrate, and the n+ doped polysilicon gate is formed on the second pad oxide layer. The first polysilicon gates separate the second polysilicon gates each. A first coding region, which is a second polysilicon gate WL-b2 formed over, is formed in the semiconductor substrate abutting a second pad oxide layer, wherein the first coding region is formed by a first plus a second coding implant into the semiconductor substrate. A second coding region, which is a second polysilicon gate WL-b3 formed over, is formed in the semiconductor substrate abutting a second one of the second pad oxide layer, wherein the second coding region is formed by the second coding implant. A third coding region, which is a second polysilicon gate WL-b4 formed over is formed in the semiconductor substrate abutting a third one of the second pad oxide layer, wherein the third coding region is formed by the first coding implant. A forth coding region, which is a first polysilicon gate WL-a2 formed over is formed in the semiconductor substrate abutting a first one of the first pad oxide layer, wherein the forth coding region is formed by the second coding implant.

The method comprises following steps: firstly, an in-situ n+ first polysilicon (about 50–500 nm) / pad oxide layer (about 3–30 nm) is deposited on the silicon substrate; and then an ARC layer such as a nitride layer (about 30–100 nm) is deposited to improve the resolution during the liliography process. Subsequently, a CVD nitride deposition and etching back are done to form nitride spacers on sidewalls of the first patterned gate. After coating a first photoresist on all surfaces but expose two predetermined ranges, A first boron or $BF_2^+$ coding implant into the coding region is carried out. It is noted that the each of predetermined ranges lies on the surface of the silicon substrate within the interval between two first formed gates. The photoresist is then stripped and an oxidation process is conducted in $O_2$ ambient to grow an oxide layer (about 10–50 nm) on all areas using said nitride layer as a hard mask. Subsequently, a second silicon layer (polysilicon or amorphous silicon) is deposited to refill all space between first formed gates, and then formed a thick oxide layer on the second polysilicon layer to refill a plurality grooves, wherein a plurality grooves lies on the second polysilicon layer. After that, a CMP process is done to form a flat surface using the nitride layer as an etching stopper. Finally, a second photoresist coating on all surfaces except a predetermined range is performed. The range includes a surface over two first formed gates and a second formed gate, wherein one of the two first formed gates is prior implanted by the first coding implant. And then performing a high energy, second boron coding implant is implanted into the predetermined regions to form the multistate mask ROM.

Brief Description of the Drawings

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A structure of double poly gate high-density flat mask ROM cells and a method of fabricating it to achieve the purpose of multi-states on a silicon substrate are disclosed. One exemplary structure will first be described and a preferred fabricating method will then be depicted and discussed later. The detailed mask ROM structure is best illustrated by reference to the drawings, and is described as follows.

Figure 10:
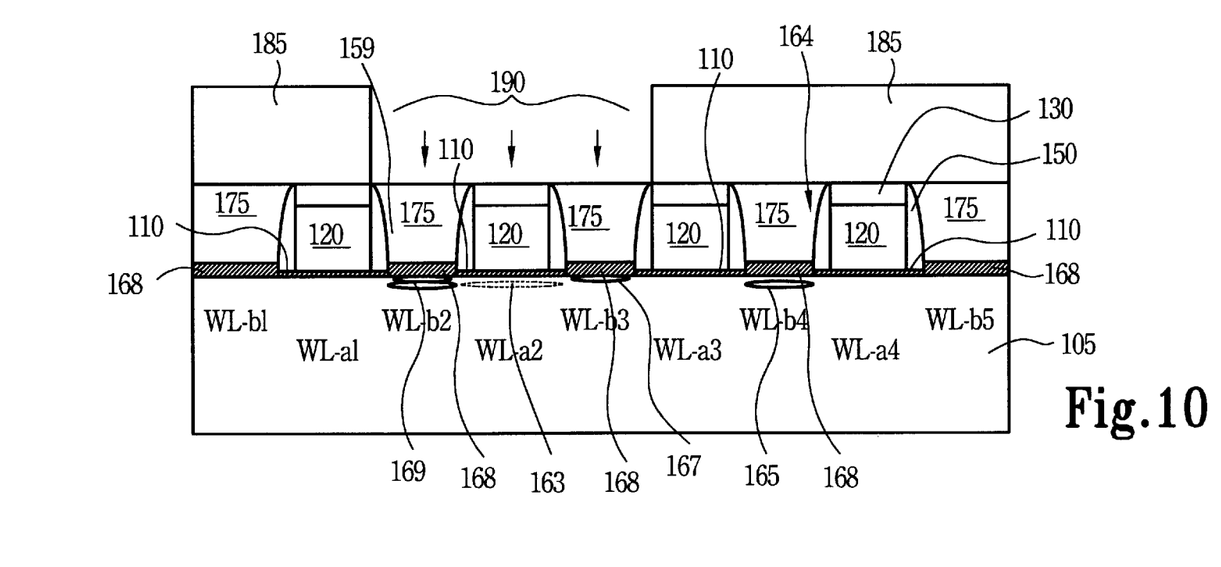
FIG. 10 is a cross-sectional view of performing second coding implant into unmask region to do another threshold voltage adjustment, in accordance with the present invention.

Referring to FIG. 10, a plurality of first polysilicon gates (e.g. each of first polysilicon gates comprises first nitride layer 130/ a n+ polysilicon layer 120/a first pad oxide layer 110, and two spacers 150 ) are formed on the semiconductor substrate 105 being separated to keep a space. The first pad oxide layer 110 is formed on the semiconductor substrate 105, and a first conductive layer, a polysilicon layer 120, is formed on a portion of the first pad oxide layer 110. A first nitride layer 130 is formed on the a n+ polysilicon layer 120; and two spacers 150 is formed over remnant portion of the first pad oxide layer 110, and formed, respectively, on two sidewalls of the first nitride layer 130 /the first n+ polysilicon layer 120. A plurality of second polysilicon gates is formed on the semiconductor substrate 105. Each of the second polysilicon gates comprises second n+ doped polysilicon gate 175/second pad oxide layer 168, wherein the second pad oxide layer 168 is formed on the semiconductor substrate 105, and the n+ doped polysilicon gate 175 is formed on the second pad oxide layer 168. The first polysilicon gates separate the second polysilicon gates each. A first coding region 160, which is a second polysilicon gate WL-b2 formed over, is formed in the semiconductor substrate 105 abutting a second pad oxide layer 168, wherein the first coding region 160 is formed by a first plus a second coding implant into the semiconductor substrate 105. A second coding region 167, which is a second polysilicon gate WL-b3 formed over, is formed in the semiconductor substrate 105 abutting a second one of the second pad oxide layer 168, wherein the second coding region 167 is formed by the second coding implant. A third coding region 165, which is a second polysilicon gate WL-b4 formed over is formed in the semiconductor substrate 105 abutting a third one of the second pad oxide layer 168, wherein the third coding region 165 is formed by the first coding implant. A forth coding region 163, which is a first polysilicon gate WL-a2 formed over is formed in the semiconductor substrate 105 abutting a first one of the first pad oxide layer 110, wherein the forth coding region is formed by the second coding implant.

The detailed processes are best illustrated by reference to the drawings, and are described as follows.

Figure 2:
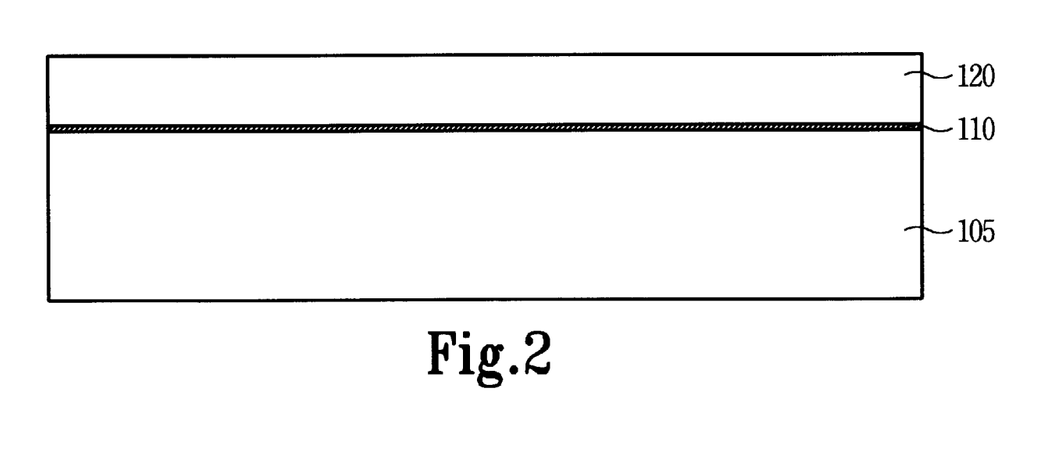
FIG. 2 is a cross-sectional view of forming a n+-doped polysilicon layer on the pad oxide layer, in accordance with the present invention.

Referring to FIG. 2, an ultra-thin pad oxide layer 110 is formed using a CVD method or a thermal growing method on a silicon substrate 105 The pad oxide 110 thickness is about 3–30 nm. Then a high concentration, in-situ n-type doped polysilicon 120 is deposited on the pad oxide 110. In a preferred embodiment, the n-type dopants are phosphorus or arsenic atoms. Preferably, the doping concentration is about $5 \times 10^{19} - 5 \times 10^{21}/cm^3$, and the thickness of n+ polysilicon 120 is about 50–500 nm.

Figure 3:
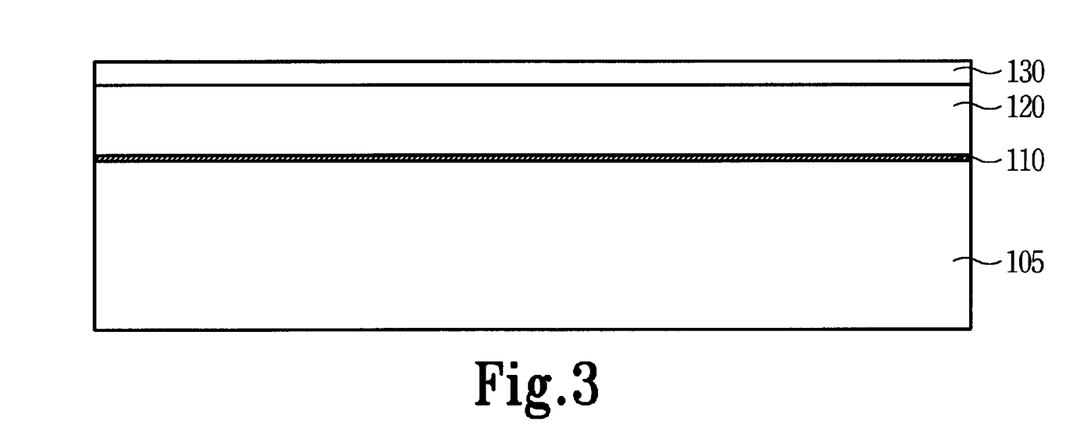
FIG. 3 is a cross-sectional view of deposited a nitride layer on the n+-doped polysilicon layer as an anti-reflection coating layer, in accordance with the present invention.

Referring to FIG. 3, an antireflection coating (ARC) layer such as a thin nitride layer 130 is then deposited on the n+ polysilicon layer 120 to a thickness of about 30–100 nm. The low pressure CVD deposition SiNe layer on silicon layer for bottom antireflection coating has been found to be manufacturable for deep U-V and I-line lithography, as is reported by Ong, in the reference, "T.P. Ong, et al., 'CVD SiNx Anti-Reflection Coating for Sub-0.5 µm Lithography', Symp. On VLSI Tech. Dig., p.73 1995."

Figure 4:
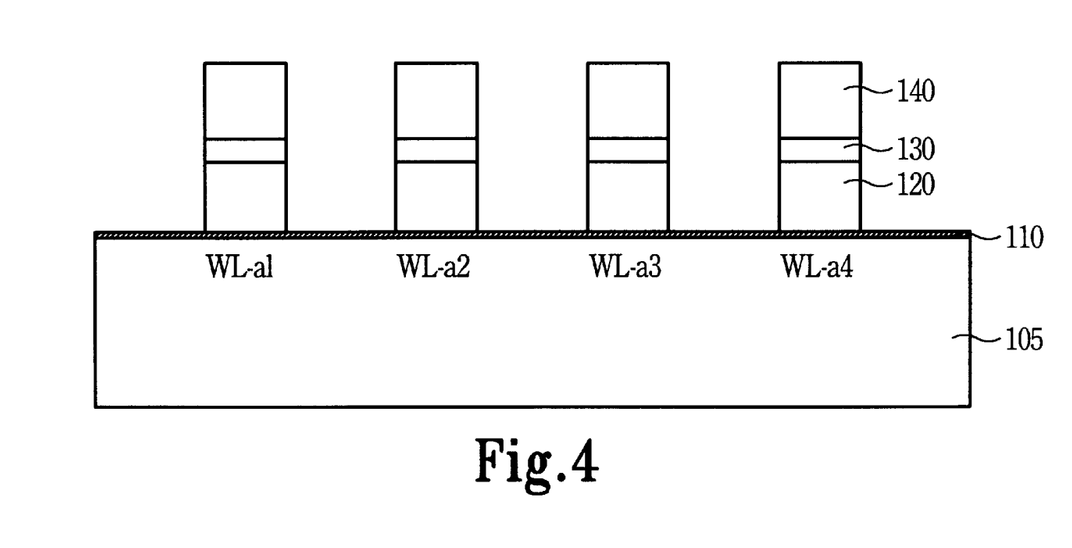
FIG. 4 is a cross-sectional view of patterning the nitride layer, the polysilicon layers and to define a first formed word lines in accordance with the present invention.

As shown in FIG. 4, a patterned photoresist 140 via conventional lithography technology is masked on the nitride layer 130 (serves as a bottom ARC) to define high density first formed poly-gates as first formed word lines WL-a1, WL-a2, WL-a3 and WL-a4, in a preferred embodiment. Here, the small letters "a" represent "first type." And then an etching step is performed. A dry etching using $CF_4/H_2$, $CH_3CHF_2$, $HBrCl_2/O_2$ and $SF_6$ as plasma source or reactive-ion-etching chemistries to remove the exposed nitride layer 130 and the n+ polysilicon layer 120 using the pad oxide layer 110 as etching stopping layer.

Figure 5:
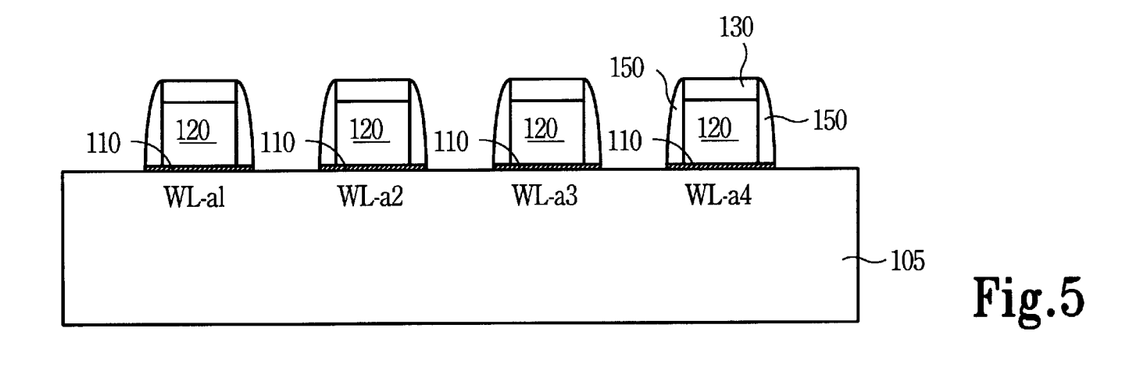
FIG. 5 is a cross-sectional view of etching back the nitride layer to form nitride spacer, in accordance with the present invention.

As shown in FIG. 5, after stripping the photoresist 140, another nitride layer (not shown) is deposited on the resultant surfaces by a CVD process, and then an anisotropic etching (e.g. a dry etching method) is carried out to form a plurality of dual nitride spacers 150. The silicon substrate 105 serves as a stopping layer while proceeding the etching process. A dipping process using dilute HF or BOE solution is performed to remove remnant pad oxide layer 110 so as to expose the silicon substrate 105. The two steps etching way have advantages of alleviating the damages and the contamination on the silicon substrate 105.

Figure 6:
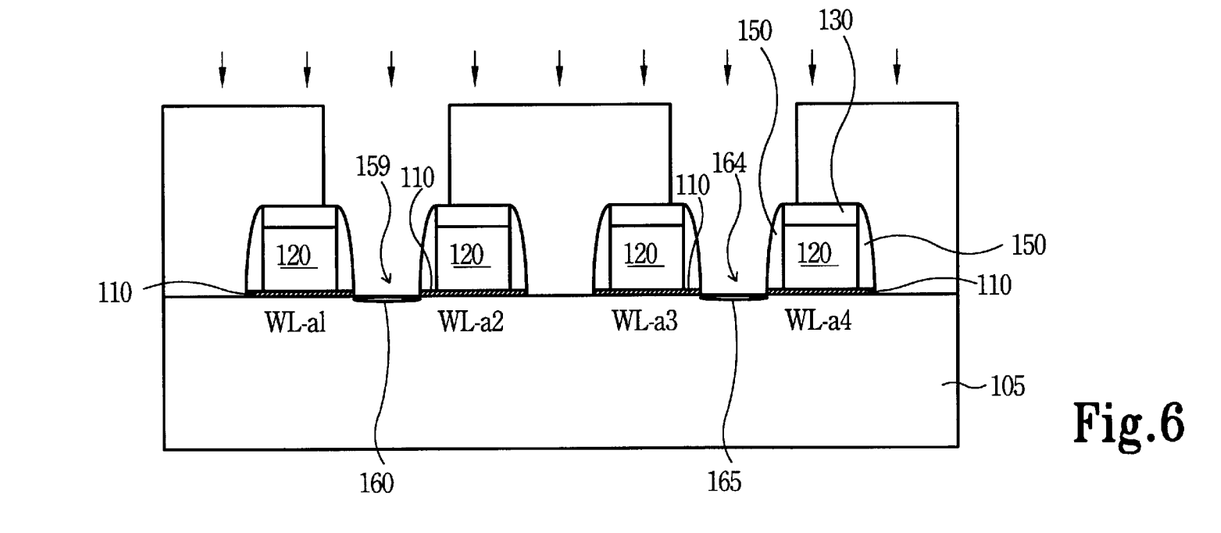
FIG. 6 is a cross-sectional view of performing first coding implant into unmask region to adjust threshold voltage, in accordance with the present invention.

Subsequently, as is shown in FIG. 6, a photoresist 155 is coated on resultant surface but exposed two predetermined ranges 159 and 164, and then a first coding implant is carried out. In a preferred embodiment, the predetermined ranges 159 and 164 lie in the interval between the nitride spacers 150 of WL-a1 and WL-a2 and between spacers 150 of WL-a3 and WL-a4, respectively. The first coding implant (as indicated by arrows) is performed using p-type ions (such as boron or $BF_2+$) with an energy and a dosage of about 10–100 keV and of about $5 \times 10^{11}$–$5 \times 10^{14}$ /cm$^2$, respectively, to form two coding regions 160 and 165 in the silicon substrate 105.

Figure 7:
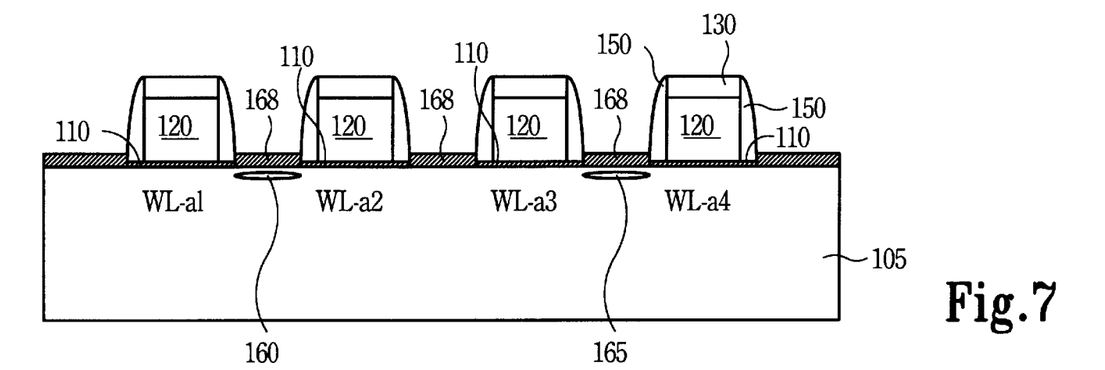
FIG. 7 is a cross-sectional view of performing an oxidation process to grow a thick oxide layer using the nitride spacers as a hard mask, in accordance with the present invention.

Referring to FIG. 7, the photoresist 155 is stripped firstly, and then a thermal oxidation process at a temperature of about 750–1150° C. in $O_2$ ambient is carried out to grow a thicker oxide layer 168 to about 10–50 nm in thickness on all areas using the nitride spacers 150 as a hard mask. The thicker gate oxide layer 168 is for forming a plurality of second formed word lines.

Figure 8:
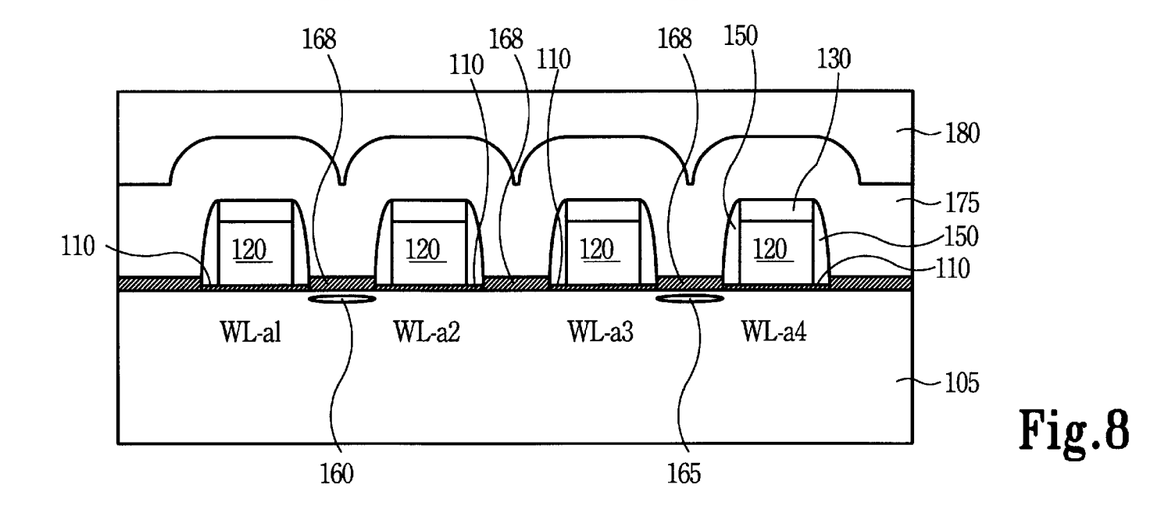
FIG. 8 is a cross-sectional view of refilling all spaces within the first formed gate with n+ doped polysilicon or α-Si, and then a thick CVD oxide film is deposited to refill all grooves on the surface of second polysilicon layer.

Please refer to FIG. 8, an in-situ n-type doped silicon layer 175, such as polysilicon layer or an amorphous silicon (α-Si) layer 175 is deposited to refill all intervals between the nitride spaces 150 of the first formed gates (as indicated by word lines WL-a1, WL-a2 . . . etc.). To deposit the a-Si layer 175, the method such as a LPCVD or a PECVD can be used (operate at temperature about 400–550 or 250–400° C., respectively). However, to deposit the polysilicon layer 175, a higher temperature process (operate at temperatures of about 560–650 ° C.) such as a LPCVD is required. The type of silicon layer being selected relies on the interval width (e.g. to refill the interval with 0.1–0.2 μm width, a-Si is prefer, but for 0.25 μm or above, the material can be poly-Si or α-Si). In a preferred embodiment, in-situ phosphorus doped or arsenic doped silicon with the concentrations come up to about $5 \times 10^{19}$–$5 \times 10^{21}$ /cm$^3$. Thereafter, a thick oxide layer 180 using a CVD method is deposited to refill the grooves on the surface of silicon layer 175.

Figure 9:
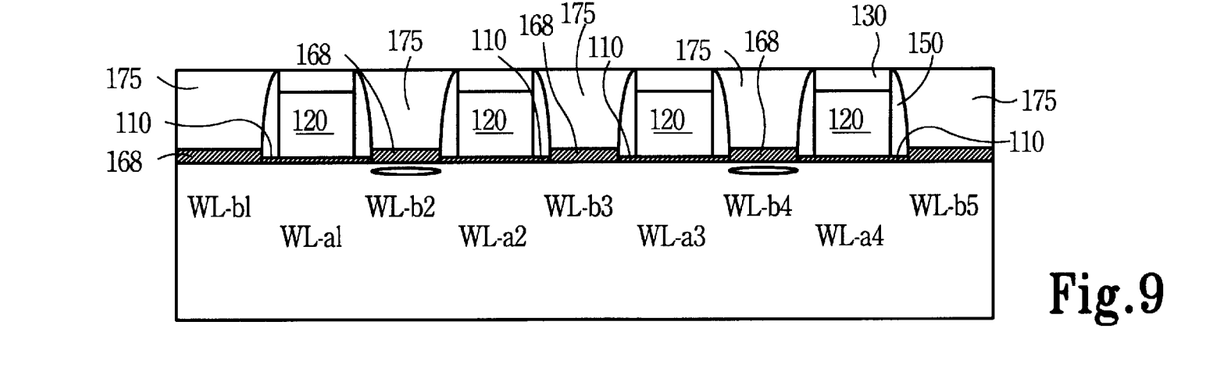
FIG. 9 is a cross-sectional view of performing planarization process by a CMP process, in accordance with the present invention.

Referring to FIG. 9, a planarization process such as a chemical/mechanical polish (CMP) process using the nitride layer 130 as a CMP stopping layer is achieved to form a flat surface. The n+ doped silicon layer 175 serves as second formed word lines of the mask ROM WL-b1, WL-b2 WL-b3, WL-b4 and WL-b5.

Referring to FIG. 10, after the CMP process, another photoresist 185 is coated on all resulting surfaces except a predetermined range 190. In a preferred embodiment, the predetermined region 190 in here includes regions of one of first formed word line WL-a2 and two of second formed word lines WL-b2 and WL-b3. After that, a high energy, second coding implant (as indicated by arrows) using p-type ions is conducted into the silicon substrate to form multi-value threshold voltages of the mask ROM. The p-type ions such as boron ions or $BF_2^+$ ions are preferred using an energy and a dosage of about 60–500 keV and about $5 \times 10^{11}$–$5 \times 10^{14}$/cm$^2$, respectively, to form three coding region 160, 163, and 167 beneath world lines WL-b2, WL-a2, and WL-b3, respectively.

In table 1, the coding regions are labeled as Vtn3, Vtn4, and Vtn5, respectively. In addition, two un-coding regions labeled by Vtn1, and Vtn2, respectively that have thinner and thicker gate oxide thickness.

TABLE 1

| Label | Thickness type 1 or type 2 | $1^{st}$ coding implant | $2^{nd}$ coding implant | Lie on |
|---|---|---|---|---|
| Vtn1 | $1^{st}$ type gate oxide | No | No | WL-a1,a3,a4 |
| Vtn2 | $2^{nd}$ type gate oxide | No | No | WL-b1,b5 |
| Vtn3 | $1^{st}$ type gate oxide | No | Yes | WL-a2 |
| Vtn4 | $2^{nd}$ type gate oxide | Yes | No | WL-b4 |
| Vtn5 | $2^{nd}$ type gate oxide | No | Yes | WL-b3 |
| Vtn6 | $2^{nd}$ type gate oxide | Yes | Yes | WL-b2 |

A comparison of the threshold voltage ($V_{tn}$) for various coding processes in

TABLE 2

| Sample | Coding Oxide (Å) | 1st Coding Implant (cm)$^{-2}$ | 2nd Coding Implant (cm)$^{-2}$ | $V_{tn}$(V) |
|---|---|---|---|---|
| A | 140 | No | No | 0.69 |
| B | 386 | No | No | 1.67 |
| C | 386 | $BF_2$-40-1.0E13 | No | 5.75 |
| D | 140 | No | B-150-2.0E14 | 3.05 |
| E | 386 | No | B-150-2.0E14 | 7.69 |
| F | 386 | $BF_2$-40-1.0E13 | B-150-2.0E14 | 8.57 | various gate oxide thickness regions is provided by simulation and is shown in table 2.

Figure 11:
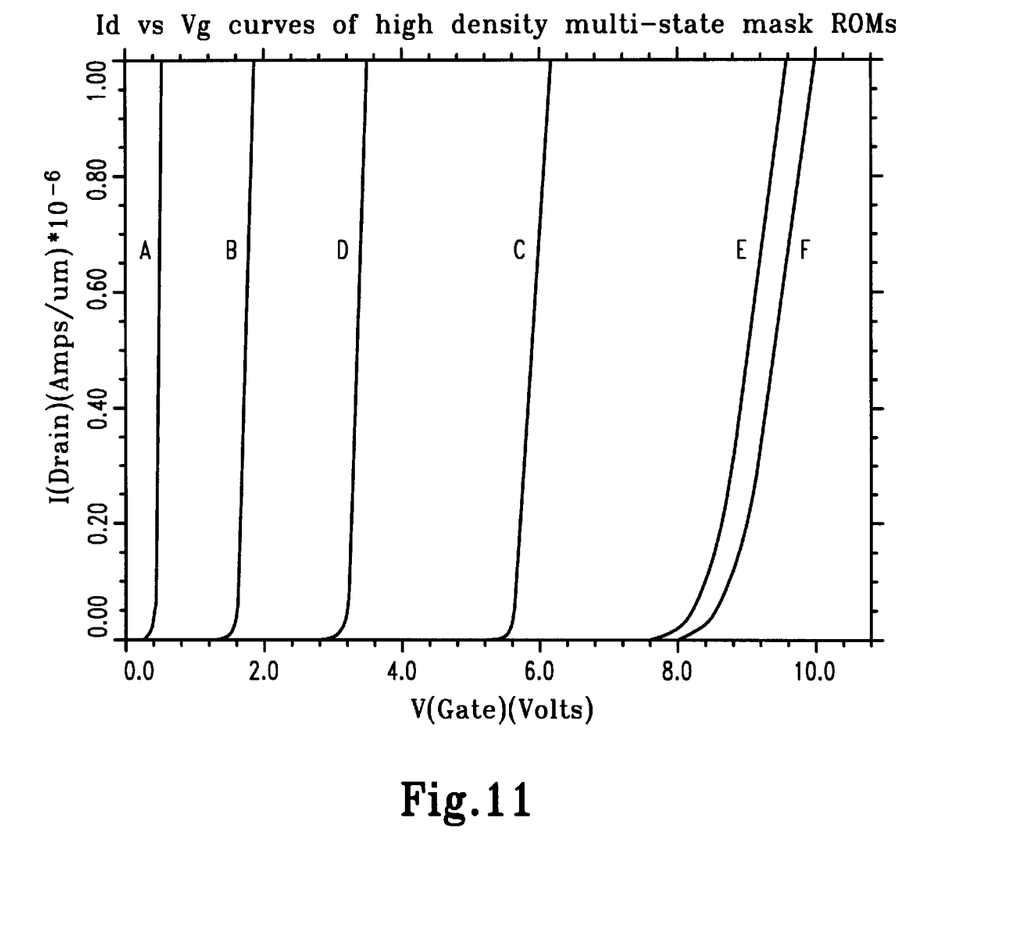
FIG. 11 is plots of the curves of the drain current ($I_d$) versus the gate voltage ($V_g$) for various mask ROM coding recipes in accordance with the present invention.

FIG. 11 is plots of the curves of the drain current ($I_d$) versus the gate voltage ($V_g$) for various mask ROM coding recipes. It shows the facts that the values of $V_{th}$ vary significantly with or without first and second coding implant and of gate oxide thickness. Samples A and B represent the regions without any coding implant, the threshold voltage varies with the gate oxide thickness. The string "$BF_2$40—1.0E13" in the row of Sample C represents the first coding implant using $BF_2^+$ as ion source, 40 keV in energy and $1.0 \times 10^{13}$/cm$^2$ in dosage, respectively. Similarity the string "B-150-2.0E14" represents the second coding implant using $B^+$ as ion source, 150 keV in energy and $2.0 \times 10^{14}$/cm$^2$ in dosage, respectively. It is obvious that there are at least four different threshold voltages (if Vtn >5 V be seen as a "one state") which can be achieved in one mask ROM cell.

The benefits of this invention are:

(1) the multi-state mask ROM cells can be easily achieved without the penalty of high band-to-band leakage current causing by the high dose born ion implantation;

(2) a high density flat cell can be obtained by using poly-gate structure; and (3) the proposed recipe is easy for manufacturing.

As is understood by a person skilled in the art, the foregoing preferred embodiment of the present invention is an illustration of the present invention rather than limiting thereon. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

What is claimed is:

1. Double poly gate multi-state flat mask ROM cells on a semiconductor substrate, said mask ROM cells comprising:
   a plurality of first polysilicon gates formed on said semiconductor substrate, each said first polysilicon gates being separated to keep a space, each of said first polysilicon gate comprising:
      a first pad oxide layer formed on said semiconductor substrate;
      a first conductive layer formed on a portion of said first pad oxide layer;
      a first nitride layer formed on said first conductive layer; and
      spacers formed on remnants of said first pad oxide layer, and formed respectively, on two sidewalls of said first nitride layer, and said first conductive layer;
   a plurality of second polysilicon gates formed on said semiconductor substrate, each said second polysilicon gates being separated by said first polysilicon gates, and each said second polysilicon gates comprising:
      a second pad oxide layer formed on said semiconductor substrate; and
      a second conductive layer formed on said second pad oxide layer;
   a first coding region formed in said semiconductor substrate abutting a first one of said second pad oxide layer;
   a second coding region formed in said semiconductor substrate abutting a second one of said second pad oxide layer, said second one of said second pad oxide layer spaced said first one of said pad oxide layer by at least one of said first pad oxide layer;
   a third coding region formed in said semiconductor substrate abutting a third one of said second pad oxide layer, said third one of said second pad oxide layer spaced the second one of said second pad oxide layer by at least one of said first pad oxide layer and spaced the first one of said second pad oxide layer by at least one of said first pad oxide layer; and
   a forth coding region formed in said semiconductor substrate abutting a first one of said first pad oxide layer, said first one of said first pad oxide layer formed between said first one and second one of said second pad oxide layer.

2. The mask ROM of claim 1, wherein said semiconductor substrate is a silicon substrate.

3. The mask ROM cells of claim 1, wherein said first and second pad oxide layer is about 3–30 nm and 10–50 nm, respectively, in thickness.

4. The mask ROM of claim 1, wherein said first conductive layer is a polysilicon layer having in-situ n-type doping and having a thickness of about 50–500 nm and to concentrations of about $5\times10^{19}$–$5\times10^{21}$ /cm$^3$, said n-type dopants are selected from the group consisting of arsenic and phosphorus.

5. The mask ROM cells of claim 1, wherein said first nitride layer is about 30–100 nm in thickness.

6. The mask ROM of claim 1, wherein said second conductive layer is a polysilicon layer contains n-type dopants to concentrations of about $5\times10^{19}$–$5\times10^{21}$/cm$^3$.

7. The mask ROM cells of claim 1, wherein said first region is formed by a first coding implant and a second coding implant into said semiconductor substrate, said second said forth coding region are formed by said second coding implant into said semiconductor substrate, said third, coding region is formed by said first coding implant into said semiconductor substrate.

8. The mask ROM of claim 7, wherein said first coding implant by p-type ions is carried out using an energy and a dosage of about 10–100 keV and of about $5\times10^{11}$–$5\times10^{14}$/cm$^2$, respectively, said p-type ion is selected from the group consisting of boron and $BF_2^+$.

9. The mask ROM cells of claim 7, wherein said second coding implant by p-type ions is carried out using an energy and a dosage of about 60–500 keV and of about $5\times10^{11}$–$5\times10^{14}$/cm$^2$, respectively, said p-type ion is selected from the group consisting of boron and $BF_2^+$.

10. Double poly gate multi-state flat mask ROM cells on a semiconductor substrate, said mask ROM cells comprising:
   a plurality of first polysilicon gates formed on said semiconductor substrate, each said first polysilicon gates being separated to keep a space, each of said first polysilicon gate comprising:
      a first pad oxide layer formed on said semiconductor substrate;
      a first conductive layer formed on a portion of said first pad oxide layer;
      a first nitride layer formed on said first conductive layer; and
      spacers formed on remnant portions of said first pad oxide layer and formed on sidewalls of said first nitride layer, and said first conductive layer;
   a plurality of second polysilicon gates formed on said semiconductor substrate, each said second polysilicon gates being separated by said first polysilicon gates, and each said second polysilicon gates comprising:
      a second pad oxide layer formed on said semiconductor substrate; and
      a second conductive layer formed on a portion of said second pad oxide layer;
   a first coding region formed in said semiconductor substrate abutting a first one of said second pad oxide layer;
   a second coding region formed in said semiconductor substrate abutting a second one of said second pad oxide layer, said second one of said second pad oxide layer being nearest to the first of said second pad oxide layer among all said second pad oxide layers;
   a third coding region formed in said semiconductor substrate abutting a third one of said second pad oxide layer, said third one of said second pad oxide layer being next nearest to the first of said second pad oxide layer among all said second pad oxide layers;
   a forth coding region formed in said semiconductor substrate abutting a first one of said first pad oxide layer, said first one of said first pad oxide layer lies between said first one and second one of said second pad oxide layer.

11. The mask ROM cells of claim 10, wherein said semiconductor substrate is a silicon substrate.

12. The mask ROM cells of claim 10, wherein said first and second pad oxide layer is about 3–30 nm and 10–50 rum, respectively, in thickness.

13. The mask ROM cells of claim 10, wherein said first conductive layer is a polysilicon layer having in-situ n-type doping and having a thickness of about 50–500 nm and to concentrations of about $5\times10^{19}$–$5\times10^{21}$/cm$^3$, said n-type dopants are selected from the group consisting of arsenic and phosphorus.

14. The mask ROM cells of claim 10,wherein said first nitride layer is about 30–100 nm in thickness.

15. The mask ROM cells of claim 10,wherein said second conductive layer is a polysilicon layer contains n-type dopants to concentrations of about $5\times10^{19}$–$5\times10^{21}$/cm$^3$.

16. The mask ROM cells of claim 10,wherein said first region is formed by a first coding implant and a second coding implant into said semiconductor substrate, said second aid forth coding region are formed by said second coding implant into said semiconductor substrate, aid third coding region is formed by said first coding implant into said semiconductor substrate.

17. The mask ROM cells of claim 16, wherein said first coding implant by p-type ions is carried out using an energy and a dosage of about 10–100 keV and of about $5\times10^{11}$–$5\times10^{14}$/cm$^2$, respectively, said p-type ion is selected from the group consisting of boron and $BF_2^+$.

18. The mask ROM cells of claim 16,wherein said second coding implant by p-type ions is carried out using an energy and a dosage of about 60–500 keV and of about $5\times10^{11}$–$5\times10^{14}$/cm$^2$, respectively, said p-type ion is selected from the group consisting of boron and $BF_2^+$.

* * * * *